US011930724B2

United States Patent
Ok et al.

(10) Patent No.: US 11,930,724 B2
(45) Date of Patent: Mar. 12, 2024

(54) PHASE CHANGE MEMORY CELL SPACER

(71) Applicant: International Business Machines Corporation, Armonk, NY (US)

(72) Inventors: Injo Ok, Loudonville, NY (US); Nicole Saulnier, Slingerlands, NY (US); Muthumanickam Sankarapandian, Niskayuna, NY (US); Andrew Herbert Simon, Fishkill, NY (US); Steven Michael McDermott, Wynantskill, NY (US); Iqbal Rashid Saraf, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 17/407,519

(22) Filed: Aug. 20, 2021

(65) Prior Publication Data
US 2023/0058218 A1 Feb. 23, 2023

(51) Int. Cl.
*H10N 70/00* (2023.01)
*H10N 70/20* (2023.01)

(52) U.S. Cl.
CPC ......... *H10N 70/801* (2023.02); *H10N 70/063* (2023.02); *H10N 70/231* (2023.02); *H10N 70/826* (2023.02); *H10N 70/8413* (2023.02); *H10N 70/8828* (2023.02)

(58) Field of Classification Search
CPC .................................................. H10N 70/231
See application file for complete search history.

(56) References Cited

U.S. PATENT DOCUMENTS

| | | | |
|---|---|---|---|
| 7,488,967 B2 | 2/2009 | Burr et al. | |
| 7,923,712 B2 | 4/2011 | Arnold et al. | |
| 8,026,543 B2 | 9/2011 | Song et al. | |
| 8,138,028 B2 | 3/2012 | Lung et al. | |
| 9,431,610 B2 | 8/2016 | Park | |
| 10,056,546 B2 | 8/2018 | BrightSky et al. | |
| 10,147,876 B1 | 12/2018 | Huang et al. | |
| 2007/0029676 A1 | 2/2007 | Takaura | |
| 2016/0365513 A1 | 12/2016 | Sung | |
| 2019/0088863 A1 | 3/2019 | Lu | |
| 2023/0098562 A1* | 3/2023 | Brew | H10N 70/826 257/4 |
| 2023/0180644 A1* | 6/2023 | Gong | H10N 70/826 365/163 |

FOREIGN PATENT DOCUMENTS

CN 105609632 B 3/2019

OTHER PUBLICATIONS

Koelmans et al., "Projected phase-change memory devices," Nature Communications, Sep. 3, 2015, 7 pages.
(Continued)

*Primary Examiner* — Mounir S Amer
(74) *Attorney, Agent, or Firm* — Grant M. McNeilly (57) ABSTRACT

A phase change memory (PCM) cell includes an electrode, a heater electrically connected to the electrode, a PCM material electrically connected to the heater, a second electrode electrically connected to the PCM material, an electrical insulator surrounding the PCM material, and a shield positioned between the PCM material and the electrical insulator, the shield comprising a reactive-ion-etching-resistant material.

13 Claims, 10 Drawing Sheets

(56) References Cited

OTHER PUBLICATIONS

Wang et al., "Nanopore patterning using Al2O3 hard masks on SOI substrates," Journal of Micromechanics and Microengineering, Jun. 18, 2015, 3 pages. <https://iopscience.iop.org/article/10.1088/0960-1317/25/7/075020/meta>.
International Search Report and Written Opinion dated Dec. 15, 2022, for International Application No. PCT/EP2022/073163, filed Aug. 19, 2022.

* cited by examiner

PHASE CHANGE MEMORY CELL SPACER

BACKGROUND

The present invention relates to computer memory, and more specifically, to phase change material memory devices with spacers.

Phase change memory (PCM) can be utilized for both training and inference in analog computing for artificial intelligence. The PCM structures can include phase change memristive devices with tunable conductivities and overall high device resistance with high retention to minimize energy consumption. The tuning can be accomplished by forming different structural states with varying proportions of crystalline and amorphous phases of PCM material. Thereby, the electrical flow through a PCM structure can be affected by other materials surrounding the PCM structure, and the PCM material itself can be affected by chemicals and processes used in the manufacturing of a PCM structure.

SUMMARY

According to an embodiment of the present disclosure, a PCM cell includes an electrode, a heater electrically connected to the electrode, a PCM material electrically connected to the heater, a second electrode electrically connected to the PCM material, an electrical insulator surrounding the PCM material, and a shield positioned between the PCM material and the electrical insulator, the shield comprising a reactive-ion-etching-resistant material.

According to an embodiment of the present disclosure, a method of manufacturing a PCM cell includes forming a first electrode, forming a heater on the first electrode, forming a PCM material on the heater, forming a second electrode on the PCM material, forming a first shield around the PCM material, the first shield comprising a first reactive-ion-etching-resistant material, and forming an electrical insulator surrounding the first shield.

According to an embodiment of the present disclosure, a method of manufacturing a PCM includes forming a first electrode, forming a heater on the first electrode, forming a PCM material on the heater, forming a second electrode on the PCM material, forming a first layer encapsulating the PCM material and the second electrode, the first layer comprising a first reactive-ion-etching-resistant material, and forming a second layer on the first layer also encapsulating the PCM material and the second electrode, the second layer comprising a reactive-ion-etching-susceptible material.

DETAILED DESCRIPTION

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, ME uses chemically reactive plasma to remove material deposited on wafers. With RIE the plasma is generated under low pressure (vacuum) by an electromagnetic field. High-energy ions from the ME plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1A:
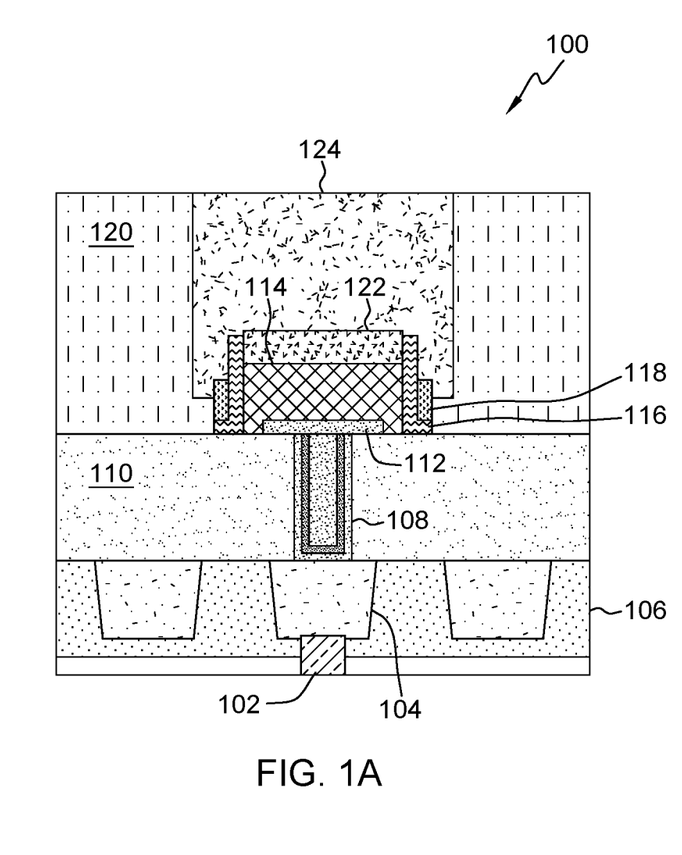
FIG. 1A is a cross-section view of a PCM cell including a spacer, in accordance with an embodiment of the present disclosure.
Figure 1B:
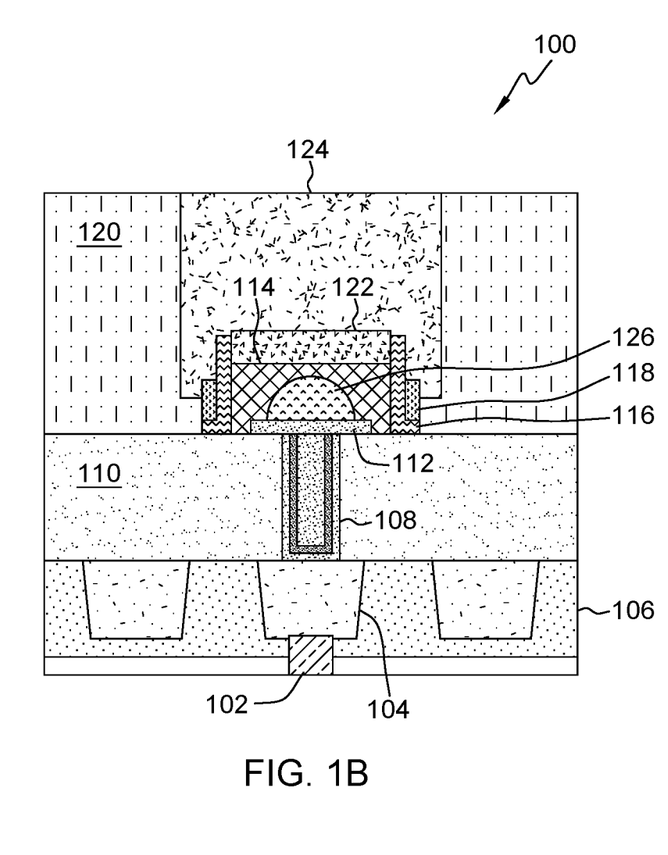
FIG. 1B is a cross-section view of the PCM cell of FIG. 1A including an amorphous zone, in accordance with an embodiment of the present disclosure.

FIGS. 1A and 1B are cross-section views of PCM cell 100 for use in, for example, an integrated circuit (not shown). In the illustrated embodiment, PCM cell 100 comprises bottom wire 102, bottom electrode 104, insulator 106, heater 108, insulator 110, projection liner 112, PCM material 114, shield 116, guard 118, insulator 120, top electrode 122, and top wire 124.

In the illustrated embodiment, the bottom of bottom electrode 104 is in direct contact with and electrically connected to the top of bottom wire 102, which can receive electrical signals from other components (not shown) of the integrated circuit. The bottom of heater 108 is in direct contact with and electrically connected to the top of bottom electrode 104. The bottom of projection liner 112 is in direct contact with and electrically and thermally connected to the top of heater 108. The bottom of PCM material 114 is in direct contact with and electrically and thermally connected to the top of projection liner 112. The bottom of top electrode 122 is in direct contact with and electrically connected to the top of PCM material 114. The bottom of top wire 124 is in direct contact with and electrically connected to the top of top electrode 122, and top wire 124 can deliver electrical signals from PCM cell 100 to other components (not shown) of the integrated circuit.

In the illustrated embodiment, shield 116 is in direct contact with and laterally surrounds the outer sides of PCM material 114 and some of top electrode 122. As such, shield 116 encloses PCM material 114 on all parallel sides in at least one direction (e.g., the sides that extend vertically, as shown in FIG. 1A). In some embodiments, shield 116 laterally surrounds all of the sides of top electrode 122, although in other embodiments, shield 116 is coterminous with the top of PCM material 114. In addition, guard 118 is in direct contact with and laterally surrounds at least some of the outer side of shield 116. The remainder of the outer side of shield 116 is in direct contact with and surrounded by top wire 124 and insulator 120, although in some embodiments, all of the outer side of shield 116 is in direct contact with and surrounded by top wire 124 or insulator 120. Similarly, some of the outer side of guard 118 is in direct contact with and laterally surrounded by top wire 124 and insulator 120, although in some embodiments, all of the outer side of guard 118 is in direct contact with and surrounded by top wire 124 or insulator 120.

In the illustrated embodiment, insulators 106, 110, 120 structurally support and electrically isolate the other components of PCM cell 100, selectively, and fill in the space therebetween, as appropriate. Thus, the outer side of bottom electrode 104 is in direct contact with and laterally surrounded by insulator 106, and the outer side of heater 108 is in direct contact with and laterally surrounded by insulator 110. Furthermore, the bottom sides of projection liner 112, PCM material 114, and shield 116 in direct contact with and axially adjacent to insulator 110, and top wire 124 is in direct contact with and laterally and axially adjacent to insulator 120.

In the illustrated embodiment, a cross-section of PCM cell 100 (into the page in FIG. 1) can be circular, although in other embodiments, it can be rectangular, square, oval, or any other suitable shape. In addition, the widths of PCM material 114 and top electrode 122 are the same, whereas the width of heater 108 is substantially reduced, comparatively (e.g., three to seven times smaller, or about five times smaller). Thereby, PCM cell 100 can be said to have a mushroom configuration wherein an electrical signal (i.e., electrical current) can flow from bottom electrode 104 to top electrode 122 through heater 108, projection liner 112, and PCM material 114.

In the illustrated embodiment, bottom electrode 104 and top electrode 122 are comprised of a very electrically conductive material, such as metal or metallic compound, for example, titanium nitride (TiN) or tungsten (W). Heater 108 is an electrode that is comprised of TiN or a higher resistance metal, such as, for example, titanium tungsten (TiW), tantalum nitride (TaN), or titanium aluminide (TiAl), and has a relatively narrow cross-sectional area, which focuses electrical current that is run through PCM cell 100. This allows heater 108 to generate heat through resistive heating during a pulse of electricity, which can be used to selectively change the temperature of PCM material 114, for example, above the crystallization temperature and the melting temperature of PCM material 114. In addition, heater 108 can be comprised of multiple different electrically conductive materials that can be arranged in multiple layers.

In the illustrated embodiment, insulators 106, 110, 120 are comprised of a dielectric (electrical insulating) material, such as, for example, silicon nitride (SiN), silicon oxide ($SiO_2$), silicon nitride carbide (SiNC), or tetraethyl orthosilicate (TEOS). In some embodiments, all of the insulators 106, 110, 120 are the same material, and in other embodiments, different materials are used for some or all of insulators 106, 110, 120. In addition, shield 116 is comprised of a reactive-ion-etching-resistant (RIER) material, such as, for example, aluminum nitride (AlN), aluminum oxide ($Al_2O_3$), or aluminum oxynitride ($AlO_xN_y$). Guard 118 is comprised of a reactive-ion-etching-susceptible (RIES) material, such as, for example, silicon nitride (SiN). The difference in the materials of shield 116 and guard 118 can be utilized during the manufacturing of PCM cell 100. For example, there is significant selectivity with respect to the removal of AlN and the removal of SiN. More specifically, SiN can be removed using a ME process, which is substantially less effective for removing AlN. On the other hand, certain wet etching processes and chemicals can remove AlN without substantially removing SiN. For example, $Al_2O_3$ has a higher selectivity with chlorine gas ($Cl_2$), argon (Ar), and an argon-boron-chlorine ($Ar/B/Cl_2$) mixture. Furthermore, the SiN etching rate is related to carbon tetrafluoride ($CF_4$) and oxygen ($O_2$), while the $Al_2O_3$ etching rete is related to aluminum chloride ($AlCl_3$) or a chlorine-boron trichloride ($Cl_2/BCl_3$) mixture. Therefore, fluorine (F) and $Cl_2$ can provide RIE selectivity between $Al_2O_3$ and SiN or $SiO_2$.

In the illustrated embodiment, PCM material 114 is composed essentially of a phase change material such as a germanium-antimony-tellurium (GST), gallium-antimony-tellurium (GaST), or silver-iridium-antimony-telluride (AIST) material, although other materials can be used as appropriate. Examples of other PCM materials can include, but are not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. PCM material 114 may be undoped or doped (e.g., doped with one or more of oxygen (O), nitrogen (N), silicon (Si), or Ti). The terms "composed essentially" and "consist essentially," as used herein with respect to materials of different layers, indicates that other materials, if present, do not materially alter the basic characteristics of the recited materials. For example, a PCM material 114 consisting essentially of GST material does not include other materials that materially alter the basic characteristics of the GST material.

In the illustrated embodiment, PCM cell 100 can be operated as a memory cell by passing an electrical current pulse from bottom electrode 104 to top electrode 122 to program PCM cell 100. This can be done at a variety of voltages and/or for a variety of durations to read or write a value on PCM cell 100. For example, to write, a high voltage can be used (e.g., 1 volt (V) to 4 V) for a short duration, which can cause heater 108 to locally heat PCM material 114 beyond its melting point. Once the flow of current ceases, PCM material 114 can cool down rapidly, which forms amorphous zone 126 in a process called "resetting". Zone 126 is a dome-shaped region of PCM material 114 having an amorphous configuration, although the remainder of PCM material 114 is still in a polycrystalline configuration. In general, this amorphous configuration has no definite structure. However, there can be local, disjoint crystalline nuclei (i.e., small crystallized regions of phase change material 114) present in zone 126. The creation of zone 126 can cause the electrical resistance across PCM cell 100 to increase as compared to a solely polycrystalline configuration (a la PCM cell 100 in FIG. 1A). These resistance values of PCM cell 100 can be read without changing the state of PCM material 114 (including that of zone 126) or the resistance value of PCM cell 100, for example, by sending a current pulse at a low voltage (e.g., 0.2 V) from bottom electrode 104 to top electrode 122.

In addition, PCM material 114 can be rewritten and returned back to a solely polycrystalline configuration by "setting" PCM cell 100. One way to rewrite PCM material 114 uses a high voltage electrical pulse (e.g., 1 V to 4 V) for a short period of time (e.g., 10 nanoseconds (ns)), which can cause PCM material 114 to heat up beyond its crystallization point but not to its melting point. Since the crystallization temperature is lower than the melting temperature, once the flow of current ceases, PCM material 114 can anneal and form crystals. Another way to rewrite PCM material 114 uses an electrical pulse with a relatively long trailing edge (e.g., 1 microsecond) (as opposed to a square pulse with a relatively short trailing edge on the order of nanoseconds) that is strong enough to heat PCM material 114 beyond its melting point, after which, PCM material 114 is cooled down slowly, allowing crystals to form. Either of these processes cause the electrical resistance across PCM cell 100 to decrease as compared to having an amorphous zone 126 (à la PCM cell 100 in FIG. 1B). This new resistance value can then be read using current at a low voltage (e.g., 0.2 V) without changing the state of PCM material 114 or the resistance value of PCM cell 100.

In some embodiments, the melting temperature of PCM material 114 is about 600° C. In some embodiments, the crystallization temperature of PCM material 114 is about 180° C. In addition, the process of setting and resetting PCM cell 100 can occur repeatedly, and in some embodiments, different zones 126 with different resistances can be created in PCM materials 114 (e.g., due to having different sizes of zone 126 and/or amounts of crystallization nuclei in zone 126). This allows for PCM cell 100 to have various distinct resistances that can be created by varying the resetting parameters. Thereby, if PCM cell 100 is considered to represent information digits, these digits can be non-binary (as opposed to traditional bits). However, in some embodiments, PCM cell 100 can be used as a bit by either having or not having a uniform zone 126 in PCM material 114. In such embodiments, PCM cells 100 can have a high resistance (a.k.a., low voltage output or "0") or low resistance (a.k.a., high voltage output or "1").

The components and configuration of PCM cell 100 allows for shield 116 to protect the side of PCM material 114 from contacting top wire 124. This can prevent PCM material 114 from being contaminated by the material of top wire 124, and this also can prevent an electrical path directly from PCM material 114 to top wire 124 (i.e., bypassing top electrode 122). However, direct electrical contact is maintained between PCM material 114 and top electrode 122, and between top electrode 122 and top wire 124.

Figure 2:
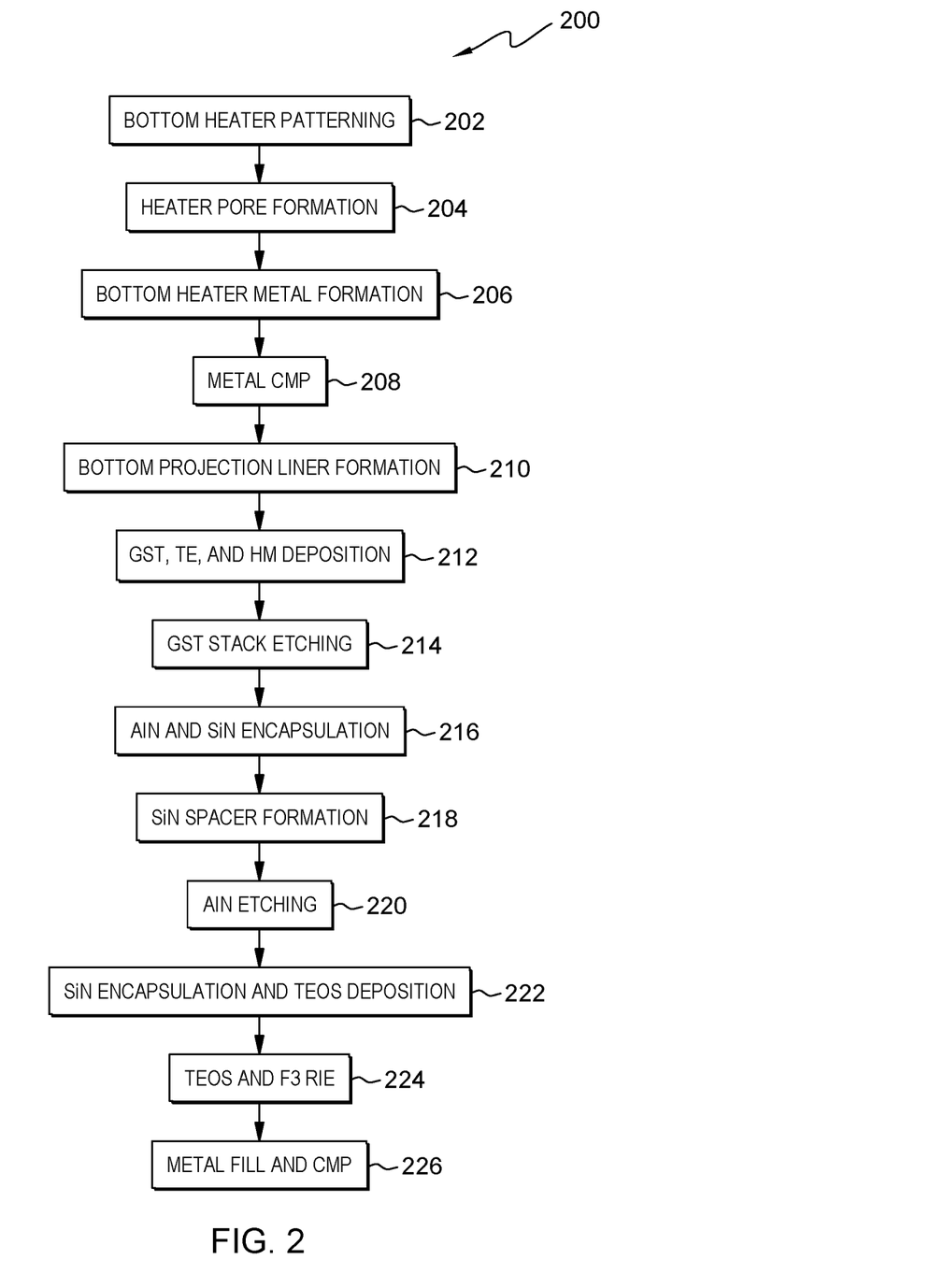
FIG. 2 is a flowchart of a method of manufacturing the PCM cell of FIG. 1A, in accordance with an embodiment of the present disclosure.

FIG. 2 is a flowchart of method 200 of manufacturing PCM cell 100. FIGS. 3A-3M are a series of views of method 200 of manufacturing PCM cell 100. FIGS. 2 and 3A-3M will now be discussed in conjunction with one another wherein each operation of method 200 is illustrated by one of FIGS. 3A-3M. In addition, during this discussion, references may be made to features of PCM cell 100 shown in FIGS. 1A and/or 1B.

In the illustrated embodiment, method 200 starts at operation 202, wherein insulating layer 328 and mask 330 are formed on bottom electrode 104 and insulator 106. Mask 330 is comprised of organic planarization layer (OPL) 332, silicon with anti-reflective coating (SiARC) 334, and photoresist layer 336. Photoresist layer 336 includes gap 338 for formation of via 340 during operation 204. More specifically, via 340 is formed by etching insulating layer 328 to form insulator 110, after which mask 330 is removed. At operation 206, tantalum nitride (TaN) layer 342, titanium nitride (TiN) layer 344, and TaN layer 346 are formed on insulator 110, including in via 340 down to bottom electrode 104. At operation 208, chemical mechanical polishing (CMP) is performed to remove the excess metal and form heater 108 coterminous with insulator 110. At operation 210, projection liner 112 is formed on heater 108 and insulator 110. Projection liner 112 can have a rectangular shape despite heater 108 having a circular shape (as shown in the partial perspective view of FIG. 3E and the top view of FIG. 3F), although in some embodiments, projection liner 112 is absent (i.e., projection liner 112 is never present or created during the manufacturing process within these embodiments).

In the illustrated embodiment, at operation 212, PCM layer 348, TiN layer 350, and SiN layer 352 are formed on insulator 110 and projection liner 112. In some embodiments, PCM layer 348 is about 80 nanometers (nm) thick, TiN layer 350 is about 75 nm thick, and SiN layer 352 is about 220 nm thick. At operation 214, masking and etching (à la operation 202) are performed to form stack 354. Stack 354 includes PCM material 114, top electrode 122, and mask 356. At operation 216, stack 354 is encapsulated by forming RIER layer 358 and RIES layer 360 on insulator 110 and stack 354 (e.g., using a conventional process such as, for example, physical vapor deposition (PVD), chemical vapor deposition (CVD), or atomic layer deposition (ALD)). In some embodiments, RIER layer 358 is between about 2 nm and 20 nm thick or between about 6 nm and 8 nm thick, and RIES layer 360 is between about 6 nm and 12 nm thick.

Figure 3A:
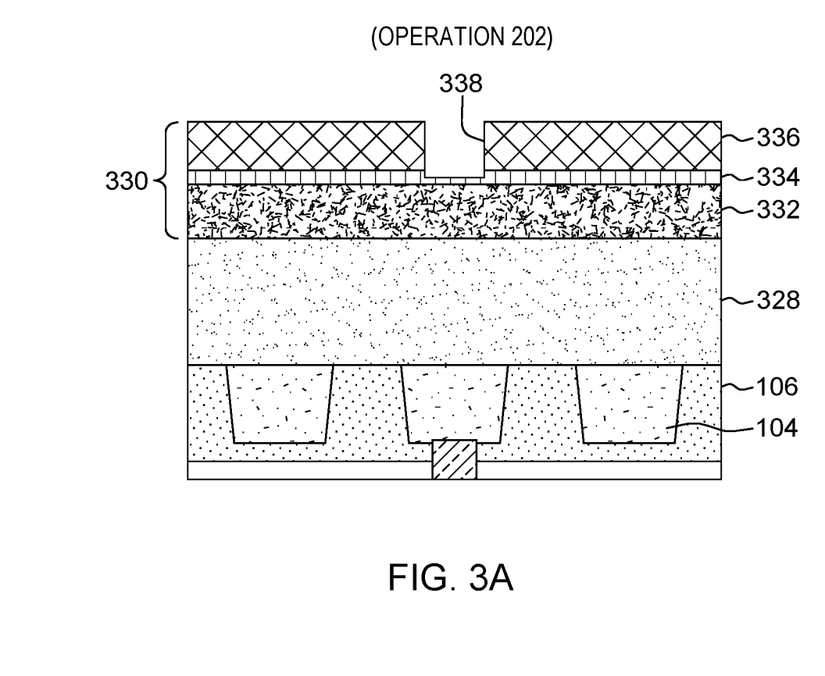
FIGS. 3A-3D and 3G-3M are a series of cross-section views of the method of FIG. 2 of manufacturing the PCM cell, in accordance with an embodiment of the present disclosure.
Figure 3B:
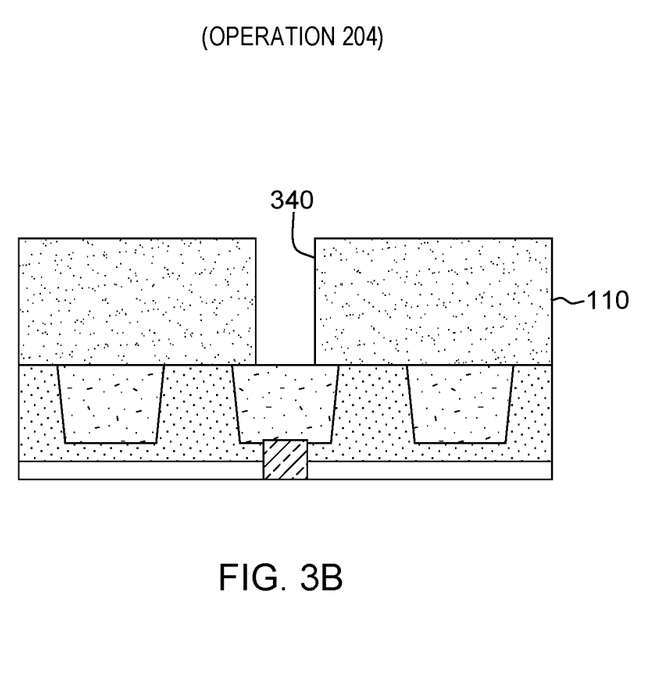
Figure 3C:
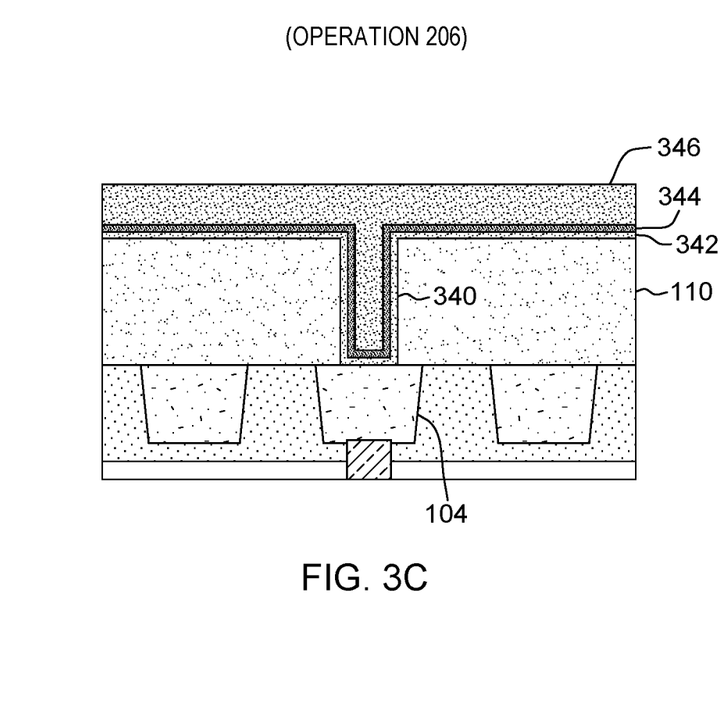
Figure 3D:
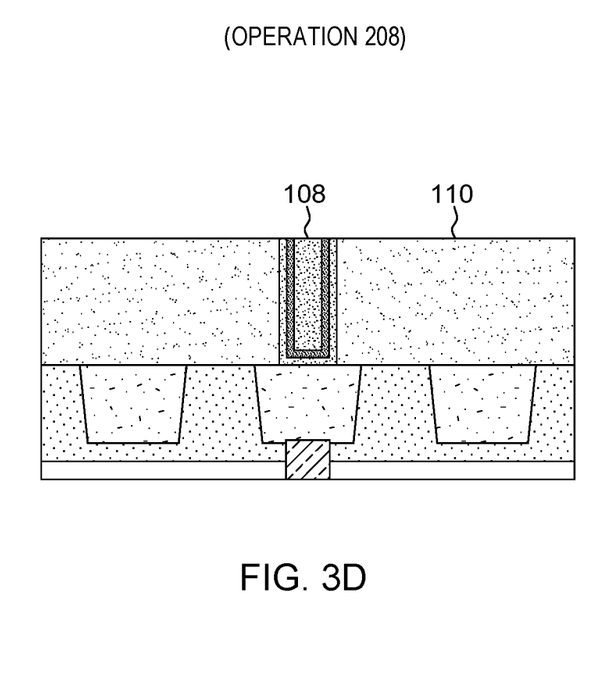
Figure 3E:
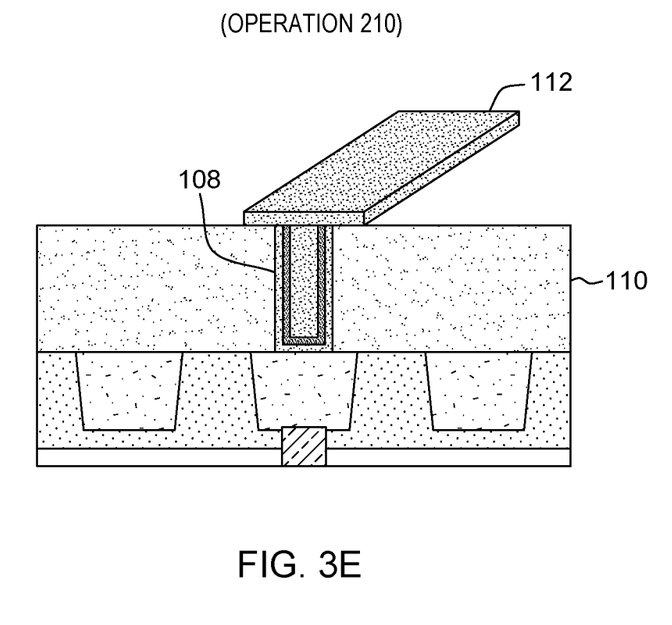
FIG. 3E is a partial perspective, cross-section view of an operation of the method of FIG. 2 of manufacturing the PCM cell, in accordance with an embodiment of the present disclosure.
Figure 3F:
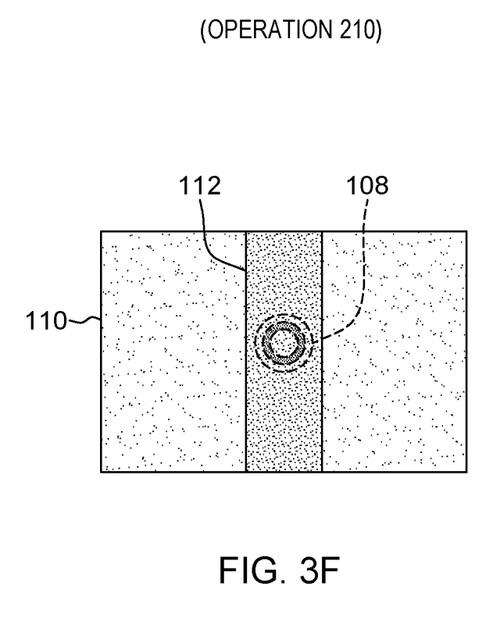
FIG. 3F is a top view of an operation of the method of FIG. 2 of manufacturing the PCM cell, in accordance with an embodiment of the present disclosure.
Figure 3G:
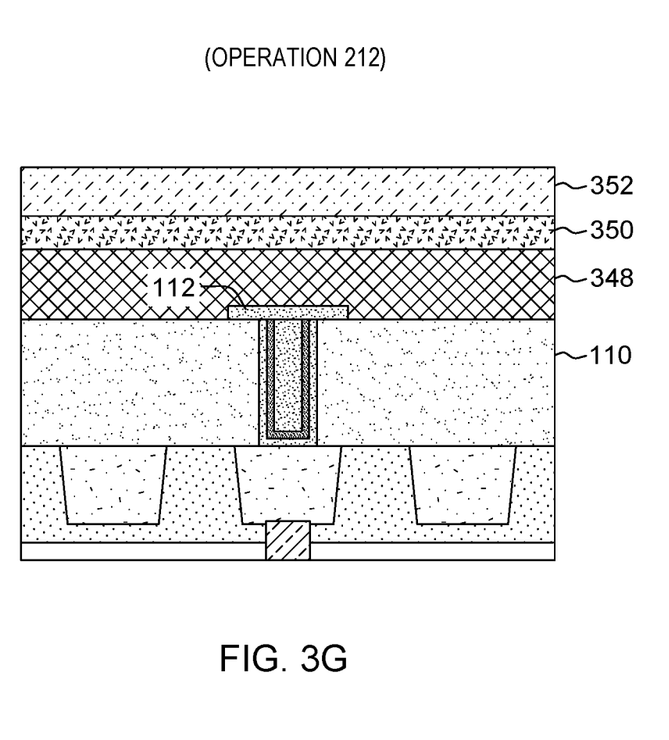
Figure 3H:
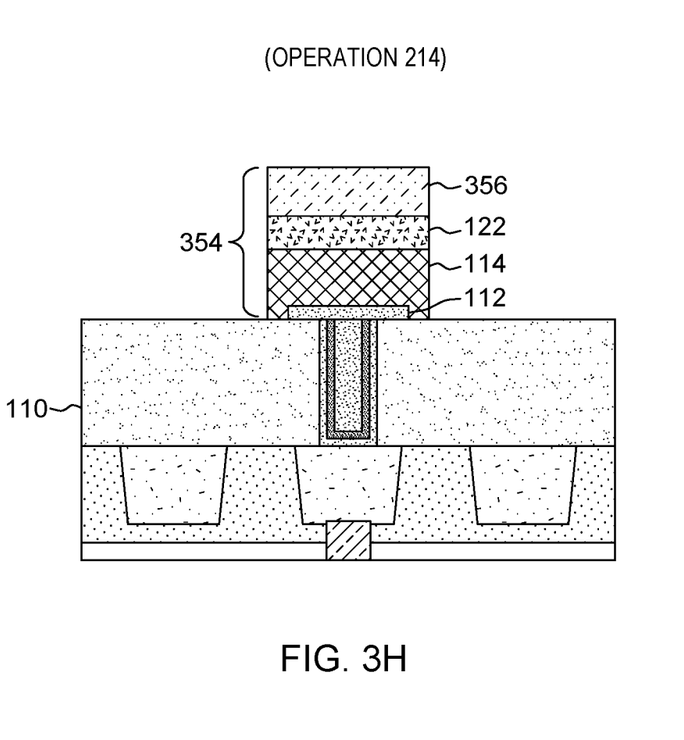
Figure 3I:
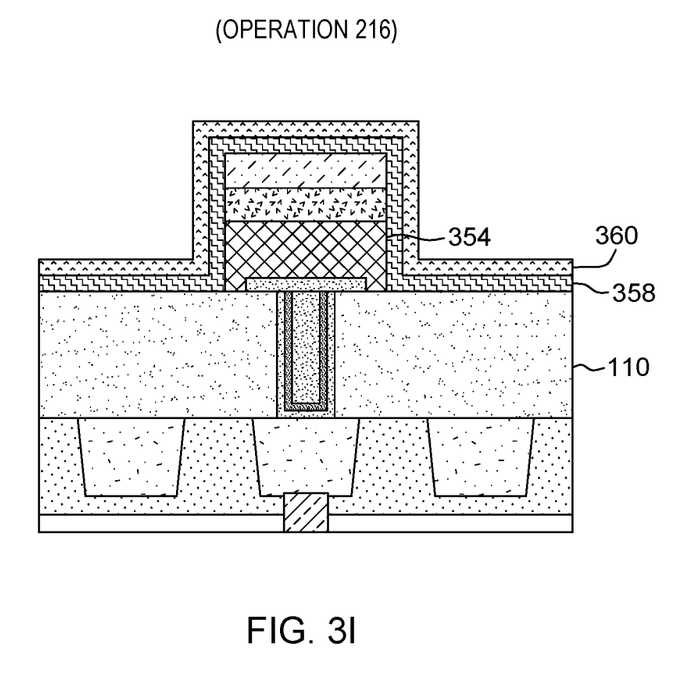
Figure 3J:
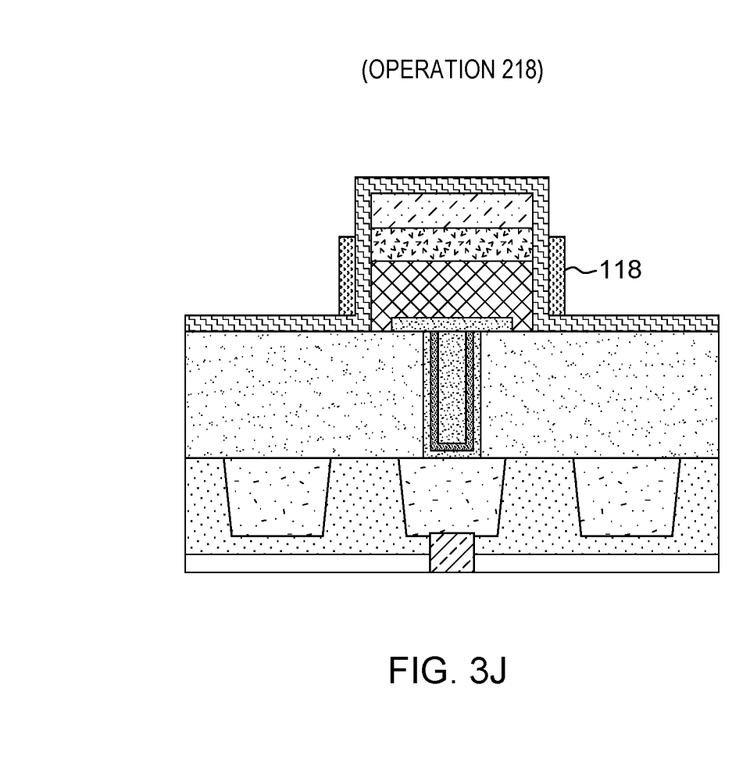

In the illustrated embodiment, at operation 218, RIES layer 360 is etched to form guard 118 using a process that has minimal effect on RIER layer 358 (e.g., a ME process).

Figure 3K:
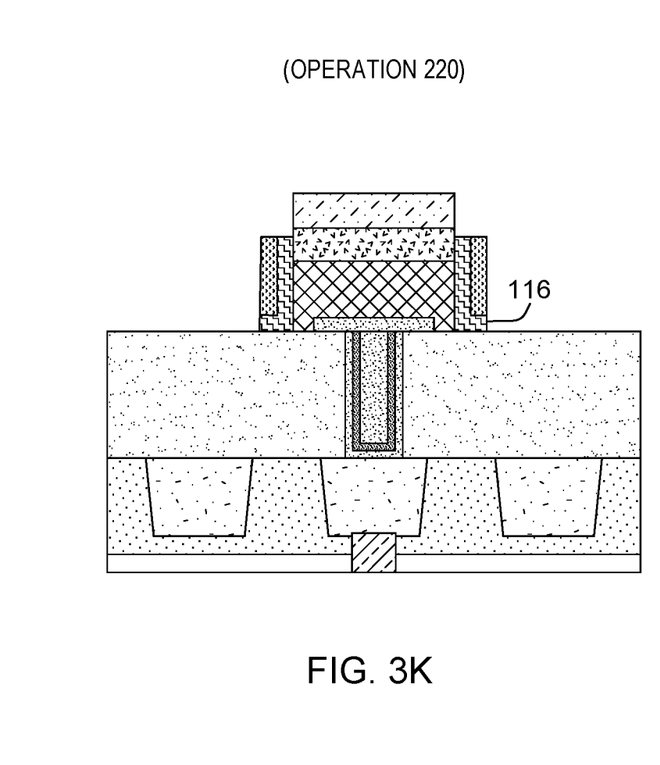
Figure 3L:
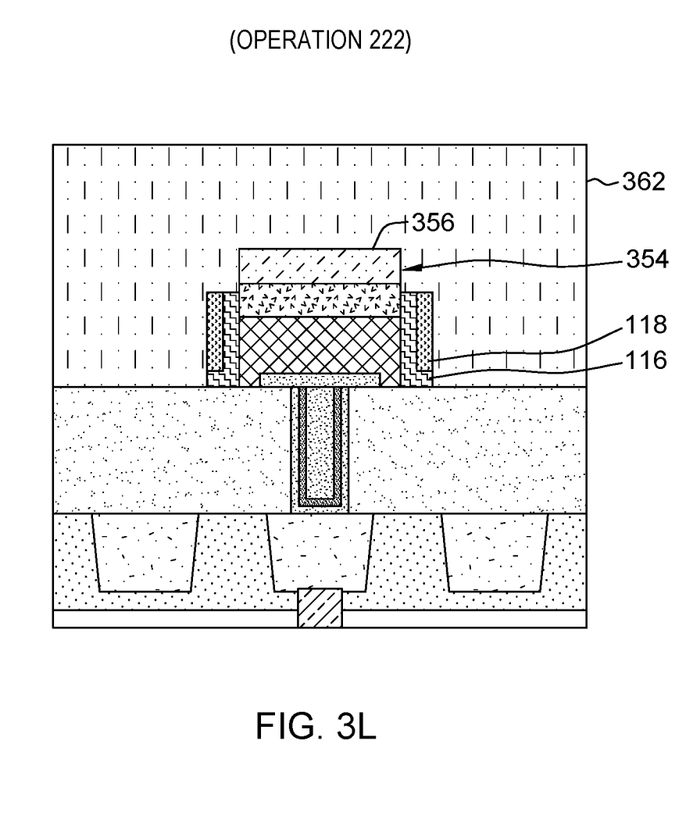

At operation 220, RIER layer 358 is etched to form shield 116 using a process that has minimal effect on guard 118 (e.g., a wet etching process). Because operation 220 does not substantially affect guard 118, the height of shield 116 is dependent on the height of guard 118. In some embodiments, to protect PCM material 114, shield 116 (and guard 118) are at least as tall as PCM material 114. However, to allow full contact for top electrode 122, shield 116 (and guard 118) are no taller than top electrode 122. Thereby, shield 116 (and guard 118) extend up and terminate between the bottom and the top of top electrode 122, meaning that shield 116 is between about 80 nm and 135 nm tall.

Figure 3M:
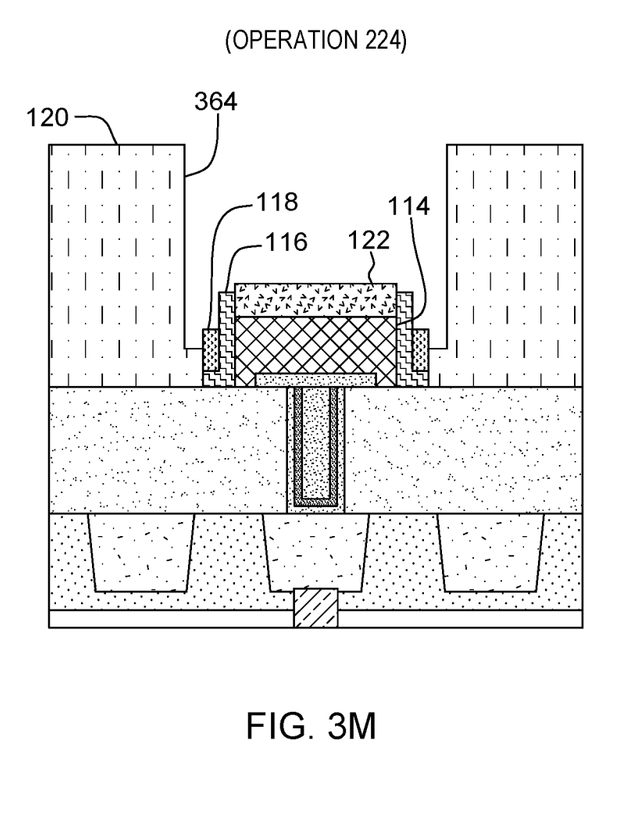

In the illustrated embodiment, at operation 222, shield 116, guard 118, and stack 354 are incapsulated by forming insulating layer 362 on insulator 110, shield 116, guard 118, and stack 354. At operation 224, pore 364 is etched (e.g., using an RIE process) into insulating layer 362 which forms insulator 120, removes mask 356 (shown in FIG. 3L), and exposes top electrode 122. Operation 224 would nominally stop etching once the entire top surface of top electrode 122 was exposed, but as shown in FIG. 3M, operation 224 has slightly overetched. This overetching has removed a portion of guard 118, shortening it, but it has not significantly affected shield 116 (and in some embodiments, guard 118 could be completely removed, for example, at operation 224). Therefore, by virtue of having shield 116 surround PCM material 114 in a lateral direction, shield 116 can protect PCM material 114 from being exposed to the chemicals and processes that occur during operation 224. At operation 226, top wire 124 is formed in pore 364, and top wire 124 connects with top electrode 122. A CMP process can also be employed to make top wire 124 coterminous with insulator 120, which completes the formation of PCM cell 100 (shown in FIG. 1A).

The components, configuration, and operation of PCM cell 100 and method 200 allow for PCM material 114 to be protected from damage due to material removal, contamination, and chlorine leeching from the etching process at operation 224. This is true even if the etching process goes beyond its nominal goal.

Figure 4A:
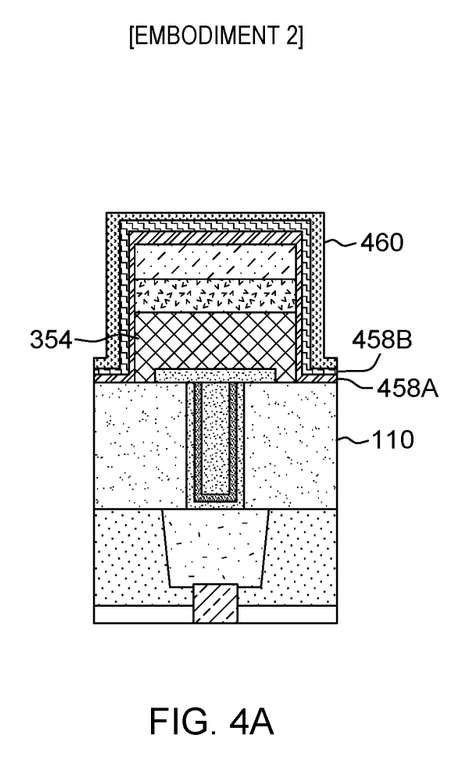
FIG. 4A is a cross-section view of an alternate embodiment PCM cell in mid-manufacture, in accordance with an embodiment of the present disclosure.

FIG. 4A is a cross-section view of an alternate embodiment PCM cell 400 (shown in FIG. 4B) in mid-manufacture, such as after encapsulation of stack 354 (a la operation 216). However, in the illustrated embodiment, stack 354 is encapsulated by forming RIER layer 458A, RIER layer 458B, and RIES layer 460 on insulator 110 and stack 354 (e.g., using a conventional process such as, for example, physical vapor deposition (PVD), chemical vapor deposition (CVD), or atomic layer deposition (ALD)). RIER layer 458A is different from RIER layer 458B in that, for example, RIER layer 458A is comprised of $Al_2O_3$ whereas RIER layer 458B is comprised of AlN. In some embodiments, RIER layer 458A is between about 1 nm and 10 nm thick, RIER layer 458B is between about 2 nm and 20 nm thick, and RIES layer 460 is between about 4 nm and 40 nm thick.

Figure 4B:
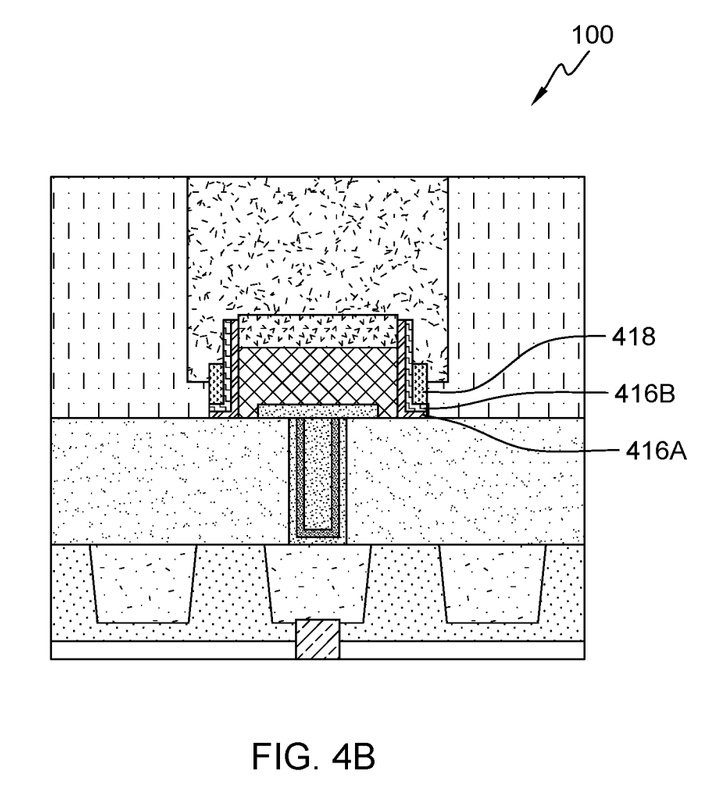
FIG. 4B is a cross-section view of the alternate embodiment PCM cell of FIG. 4A fully manufactured, in accordance with an embodiment of the present disclosure.

The result of the alternate embodiment encapsulation of FIG. 4A is shown in FIG. 4B, which is a cross-section view of PCM cell 400. In the illustrated embodiment, PCM cell 400 includes shield 416A (comprised of $Al_2O_3$), shield 416B (comprised of AlN), and guard 418. Such a double-shield arrangement allows for a better dielectric insulating encapsulation material (e.g., $Al_2O_3$) to be in direct contact with stack 354 while having a better RIER material (e.g., AlN) on the exterior to protect stack 354 and shield 416A.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a phase change memory (PCM) cell, the method comprising:
   forming a first electrode;
   forming a heater on the first electrode;
   forming a PCM material on the heater;
   forming a second electrode on the PCM material;
   forming a first shield around the PCM material, the first shield comprising a first reactive-ion-etching-resistant material; and
   forming an electrical insulator surrounding the first shield.

2. The method of claim 1, wherein the first shield is positioned between the second electrode and the electrical insulator.

3. The method of claim 1, wherein forming the first shield comprises:
   encapsulating the PCM material and the top electrode with a layer of the first reactive-ion-etching-resistant material; and
   etching the layer of the first reactive-ion-etching-resistant material so that the layer of the first reactive-ion-etching-resistant material extends between a first side of the second electrode and a second side of the second electrode opposite of the first side.

4. The method of claim 1, further comprising:
   forming a guard positioned between the first shield and the electrical insulator, the guard comprising a reactive-ion-etching-susceptible material.

5. The method of claim 4, wherein the reactive-ion-etching-susceptible material comprises silicon nitride.

6. The method of claim 4, further comprising:
   forming a second shield positioned between the first shield and the PCM material, the second shield comprising a second reactive-ion-etching-resistant material that is different from the first reactive-ion-etching-resistant material.

7. The method of claim 4, wherein forming the guard comprises:
   encapsulating the PCM material, the top electrode, and a layer of the first reactive-ion-etching-resistant material with a layer of the reactive-ion-etching-susceptible material; and
   etching the layer of the reactive-ion-etching-susceptible material so that the layer of the reactive-ion-etching-susceptible material extends between a first side of the second electrode and a second side of the second electrode opposite of the first side.

8. A method of manufacturing a phase change memory (PCM) cell, the method comprising:
   forming a first electrode;
   forming a heater on the first electrode;
   forming a PCM material on the heater;
   forming a second electrode on the PCM material;
   forming a first layer encapsulating the PCM material and the second electrode, the first layer comprising a first reactive-ion-etching-resistant material; and
   forming a second layer on the first layer also encapsulating the PCM material and the second electrode, the second layer comprising a reactive-ion-etching-susceptible material.

9. The method of claim 8, further comprising:
   forming a third layer encapsulating the first layer, the PCM material, and the second electrode, the third layer comprising a second reactive-ion-etching-resistant material that is different from the first reactive-ion-etching-resistant material.

10. The method of claim 9, wherein the third layer is positioned between the first layer and the second layer.

11. The method of claim 8, further comprising forming a first electrical insulator surrounding the heater, wherein the first layer extends along a portion of the first electrical insulator.

12. The method of claim 11, further comprising forming a second electrical insulator surrounding the PCM material.

13. The method of claim 8, further comprising etching the first layer so that the first layer extends between a first side of the second electrode and a second side of the second electrode opposite of the first side.

* * * * *